(12) United States Patent
Kim et al.

(10) Patent No.: US 11,667,119 B2
(45) Date of Patent: Jun. 6, 2023

(54) INKJET PRINTHEAD

(71) Applicant: SAMSUNG ELECTRONICS CO., LTD., Suwon-si (KR)

(72) Inventors: Tae Ho Kim, Seongnam-si (KR); Eun Joo Jang, Suwon-si (KR); Tae Hyung Kim, Seoul (KR); Hyo Sook Jang, Suwon-si (KR); You Jung Chung, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 1 day.

(21) Appl. No.: 17/394,698

(22) Filed: Aug. 5, 2021

(65) Prior Publication Data
US 2022/0288930 A1 Sep. 15, 2022

(30) Foreign Application Priority Data
Mar. 9, 2021 (KR) .................. 10-2021-0031034

(51) Int. Cl.
*B41J 1/16* (2006.01)
*B41J 2/16* (2006.01)
*B41J 2/045* (2006.01)
*H01L 21/56* (2006.01)

(52) U.S. Cl.
CPC ............ *B41J 2/164* (2013.01); *B41J 2/0458* (2013.01); *B41J 2/04581* (2013.01); *B41J 2/1601* (2013.01); *H01L 21/56* (2013.01); *B41J 2/1603* (2013.01); *B41J 2/1604* (2013.01)

(58) Field of Classification Search
CPC .. B41J 2/0458; B41J 2/14201; B41J 2/14016; B41J 2/164; B41J 2/1601; B41J 2/1603; B41J 2/1604
See application file for complete search history.

(56) References Cited

U.S. PATENT DOCUMENTS

| | | | |
|---|---|---|---|
| 6,439,691 | B1 | 8/2002 | Lee et al. |
| 6,598,961 | B2 | 7/2003 | Kuk et al. |
| 6,652,076 | B2 | 11/2003 | Nakata et al. |
| 6,926,386 | B2 | 8/2005 | Shin et al. |
| 9,096,059 | B2 | 8/2015 | Hatsui et al. |
| 9,512,935 | B2 | 12/2016 | Vergne et al. |
| 10,804,417 | B2 | 10/2020 | Pschenitzka et al. |

(Continued)

FOREIGN PATENT DOCUMENTS

| | | |
|---|---|---|
| JP | 6143455 | 6/2017 |
| KR | 100216618 | 8/1999 |

(Continued)

*Primary Examiner* — Kristal Feggins
(74) *Attorney, Agent, or Firm* — Cantor Colburn LLP (57) ABSTRACT

An inkjet printhead includes a head body in which a first fine channel that is connected to an ink inlet and thus guides an inflow of ink, a second fine channel that is disposed below the first fine channel, communicated with the first fine channel through a connection via hole, and guides an outflow of the ink by being connected to an ink outlet, and a nozzle that is opened downward from the second fine channel are defined, and a micro heater that is disposed closer to the connection via hole in an upper portion of the first fine channel than to an end of the first fine channel where the first fine channel is connected to the ink inlet or an end of the second fine channel where the second fine channel is connected to the ink outlet.

14 Claims, 5 Drawing Sheets

(56) References Cited

U.S. PATENT DOCUMENTS

| | | | |
|---|---|---|---|
| 2004/0017441 A1* | 1/2004 | Shin | B41J 2/1628 347/68 |
| 2018/0311892 A1* | 11/2018 | Abbott, Jr. | C04B 35/6264 |
| 2020/0031119 A1* | 1/2020 | Bush | B41J 2/04573 |

FOREIGN PATENT DOCUMENTS

| | | |
|---|---|---|
| KR | 100400229 | 10/2003 |
| KR | 100416544 | 2/2004 |
| KR | 100428793 | 4/2004 |
| KR | 100727966 | 6/2007 |
| KR | 101416171 | 7/2014 |
| KR | 1020140134296 | 11/2014 |
| KR | 102111682 | 5/2020 |

* cited by examiner

INKJET PRINTHEAD

This application claims priority to Korean Patent Application No. 10-2021-0031034 filed on Mar. 9, 2021, and all the benefits accruing therefrom under 35 U.S.C. § 119, the content of which in its entirety is herein incorporated by reference.

BACKGROUND

1. Field

Embodiments of the invention relate to an inkjet printhead.

2. Description of the Related Art

A quantum dot ("QD")-light emitting diode ("LED") includes a hole injection layer ("HIL"), hole transport layer ("HTL"), a QD emission layer, and an electron transport layer ("ETL") between a pair of electrodes. The QD is a self-emissive material that has high color purity, quantum efficiency, wide color reproducibility, and a merit of controlling an energy band gap and color according to size. In addition, since the QD may be dispersed in a colloidal solution as nanocrystal particles that may be electrically or optically excited and thus emit light, a solution process is possible, while enabling manufacturing a low-cost and large area display. In the QD-LED, all layers except a metal electrode may be manufactured by a solution process and a thermal annealing process.

Inkjet printing is a printing method that is widely used in manufacturing organic electron devices such as organic light emitting elements and organic thin film transistors by applying a small amount of a solution to a desired position on a substrate as a merit.

SUMMARY

When inks including oxide nanoparticles ("NPs") or the like are injected into an inkjet printhead and used, a nozzle of the inkjet printhead may be clogged due to aggregation of NPs.

Embodiments of the invention provide a high-resolution inkjet printhead that enables continuous spraying of ink without nozzle clogging caused by NP precipitation or aggregation.

However, the problems to be solved by the embodiments are not limited to the above-described problems and may be variously expanded in the range of technical ideas included in the invention.

An inkjet printhead in an embodiment includes a head body in which a first fine channel that is connected to an ink inlet and thus guides an inflow of ink, a second fine channel that is disposed below the first fine channel, communicated with the first fine channel through a connection via hole, and guides an outflow of the ink by being connected to an ink outlet, and a nozzle that is opened downward from the second fine channel are defined, and a micro heater that is disposed closer to the connection via hole in an upper portion of the first fine channel than to an end of the first fine channel where the first fine channel is connected to the ink inlet or an end of the second fine channel where the second fine channel is connected to the ink outlet.

In an embodiment, the inkjet printhead may further include a passivation layer that is adjacent to the upper portion of the first fine channel and accommodates the micro heater.

In an embodiment, the passivation layer may include a polyimide ("PI").

In an embodiment, the first fine channel, the connection via hole, and the second fine channel may be communicated with each other and guide a flow of the ink in one direction such that the ink is circulated.

In an embodiment, the micro heater may be disposed eccentrically with the connection via hole.

In an embodiment, the nozzle may be disposed eccentrically with the connection via hole.

In an embodiment, the nozzle may be disposed closer to the connection via hole than to the end of the first fine channel or the end of the second fine channel.

In an embodiment, the connection via hole may extend to an opposite end of the end of the first fine channel.

In an embodiment, the connection via hole may extend to an opposite end of the end of the second fine channel.

In an embodiment, in a plan view, the second fine channel may have a portion overlapping the first fine channel.

In an embodiment, the ink may include organic or inorganic oxide NPs

In an embodiment, the organic or inorganic oxide NPs may include inorganic oxide NPs, and the inorganic oxide NPs may include metal or semimetal oxide NPs.

In an embodiment, the metal or semimetal oxide NPs may include NPs of oxides including zinc or NPs of oxides including alloys of transition metals.

In an embodiment, the oxide NPs including zinc may include ZnO, ZnMgO, ZnAlO, ZnCoO, ZnGaO, ZnZrO, ZnYO, or any combinations thereof.

The high-resolution inkjet printhead in the embodiment enables continuous spraying of inorganic oxide ink without nozzle clogging caused by precipitation or aggregation of organic material or inorganic material, and accordingly, it is possible to continuously jetting ink including NPs, or the like, thereby being applied to high resolution large-scaled area QLED display manufacturing.

In addition, the high-resolution inkjet printhead in the embodiment may also be used in an inkjet printing method for manufacturing inorganic/organic electron devices including oxide semiconductor NPs or quantum dots ("QDs"). The inorganic/organic electron devices may include printable thin film transistors, photosensors, solar cells, or the like in addition to LEDs and flat panel displays.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

The disclosure will be described more fully hereinafter with reference to the accompanying drawings, in which embodiments of the disclosure are shown. The drawings and description are to be regarded as illustrative in nature and not restrictive. Like reference numerals designate like elements throughout the specification. In addition, some constituent elements in the accompanying drawings are exaggerated, omitted, or schematically illustrated, and the size of each constituent element does not fully reflect the actual size.

The accompanying drawing is only for easy understanding of the embodiments disclosed in this specification, and the technical idea disclosed in this specification is not limited by the accompanying drawing, and it should be understood that all changes, equivalents, or substitutes included in the spirit and scope of the disclosure are included.

Terms including ordinal numbers such as first, second, and the like may be used to describe elements of various configurations, but the constituent elements are not limited by the terms. The terms are only used to distinguish one constituent element from another.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" a target element will be understood to mean positioned above or below the target element, and will not necessarily be understood to mean positioned "at an upper side" based on an opposite to gravity direction.

Throughout the specification, terms such as "include" or "have" are intended to designate the presence of features, numbers, steps, actions, constituent elements, parts, or combinations of these described in the specification, but it is to be understood that the possibility of the presence or addition of one or more other features, elements, numbers, steps, actions, constituent elements, parts, or combinations thereof is not preliminarily excluded. Therefore, when a part "comprises" a certain constituent element, this means that other constituent elements may be further included, rather than excluding other constituent elements, unless otherwise stated.

In addition, in the entire specification, when it is referred to as "in a plan view", it means when an object is viewed from above, and when it is referred to as "on a cross-section", it is viewed from the side when the object is cut vertically.

In addition, the expression "connected to" in the entire specification not only means that two or more constituent elements are directly connected to, but also means that two or more constituent elements are indirectly connected through other constituent elements, physically connected to, or electrically connected, or being referred to by different names depending on the position or function, but is integral.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" may mean within one or more standard deviations, or within ±30%, 20%, 10%, 5% of the stated value, for example.

Three methods for patterning a quantum dot ("QD")-light emitting diode ("LED") using inkjet printing may be considered.

First, according to a bubble-jet spray method, ink is ejected by controlling the size of a vapor (bubble) in a nozzle by a heater disposed on a side wall of a fine tube. When the heater is heated, the vapor is generated inside the nozzle, and when the vapor expands to the maximum, ink is sprayed. When the heating of the heater is stopped after spraying, the bubbles disappear and ink is replenished.

A thermal jet method is also similar to the bubble-jet method, but is classified by the position of the heater. The heater is disposed on the opposite or same side of a nozzle of an ink chamber, and the ink is ejected by a water vapor pressure when the heated ink is vaporized.

According to the piezo jet spraying method, ink is sprayed by applying impact according to a signal input from a back of a nozzle, like a common syringe. It is characterized by the use of a piezoelectric element whose shape changes by voltage as a driving force for ejecting ink. When a voltage is applied and the piezoelectric element is deformed and a liquid level at the tip of the nozzle increases, the ink in front of the nozzle surface is ejected by inertia when the liquid level is rapidly pulled by controlling the voltage.

In the case of organic electron devices, a piezo method that does not desire direct heat to the solution in order to exclude the issue of thermal stability may be applied. The piezo method is suitable for printing organic materials, but, in the case of a conductive oxide semiconductor such as ZnO nanoparticles ("NPs") dispersed in a polar solvent, the sol-gel reaction of ZnO in the solution is caused by an electric field generated when a voltage is applied to a piezo actuator such that the sol-gel reaction is accelerated, resulting in crystal growth and aggregation may occur, thereby causing a problem of clogging the nozzle of the printhead. ZnO has excellent conductivity with sheet resistance of about 110Ω in the state of a thin film, and when an electrolyte solution such as ethylene glycol added for ink production is used as a mixed solvent, the electric field may be affected more greatly. The more the material has conductivity, the worse the nozzle clogging phenomenon may be in the piezo method.

Therefore, a structure of an inkjet printhead is desired to manufacture electronic devices by printing ink including organic or inorganic oxide NPs dispersed in a polar solvent at ultra-high resolution without clogging the nozzle.

In an embodiment, a low temperature bubble jet printhead that does not apply a voltage and does not desire a high temperature thermal spray, as in the piezo method, is proposed.

Figure 1:
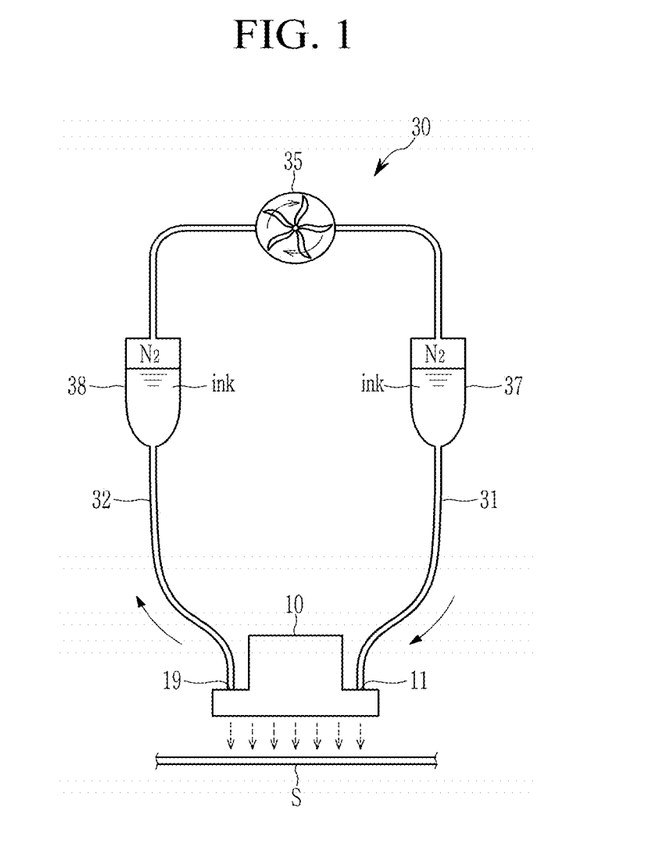
FIG. 1 is a schematic view provided for description of an embodiment of operation of the entire printing device that includes an inkjet printhead.

FIG. 1 is a schematic view provided for description of an embodiment of operation of the entire printing device that includes an inkjet printhead.

Referring to FIG. 1, an inkjet printhead 10 in the illustrated embodiment is installed and driven in a printing device 30, and sprays ink to a target substrate S such that an inorganic/organic electronic element may be manufactured. The printing device 30 includes an ink supply pipe 31 and an ink discharge pipe 32 connected to the inkjet printhead 10, and the ink supply pipe 31 and the ink discharge pipe 32 may be connected together to a pump 35.

The inkjet printhead 10 includes an ink inlet 11 and an ink outlet 19, and the ink supply pipe 31 may be connected to the ink inlet 11 and the ink discharge pipe 32 may be connected to the ink outlet 19. The ink supply pipe 31 may supply ink into the inkjet printhead 10 and the ink discharge pipe 32 may discharge ink from the inkjet printhead 10 by driving the pump 35. The ink discharged from the ink discharge pipe 32 passes through the pump 35 and then moves to the ink supply pipe 31, and is then supplied back to the inkjet printhead 10 such that the ink may be circulated.

In addition, in the outside the inkjet printhead 10, a supply buffer 37 is disposed on the ink supply pipe 31 and a discharge buffer 38 is disposed on the ink discharge pipe 32 and thus the ink supply speed and supply quantity to the inkjet printhead 10 may be buffered. An internal space of which a diameter is larger than the ink supply pipe 31 and the ink discharge pipe 32 may be defined in the supply buffer 37 and the discharge buffer 38, and the transferred ink may be temporarily stored in the internal space. The spaces not filled with ink in the internal spaces of the supply buffer 37 and the discharge buffer 38 may be filled with nitrogen ($N_2$).

The printing device 30 described with reference to FIG. 1 is an example of a structure that circulates ink by applying the inkjet printhead 10 in the illustrated embodiment, and the invention is not limited thereto. Thus, the inkjet printhead 10 in the illustrated embodiment may be applied to any printing device having a structure that supplies and discharges ink by circulating the ink.

Figure 2:
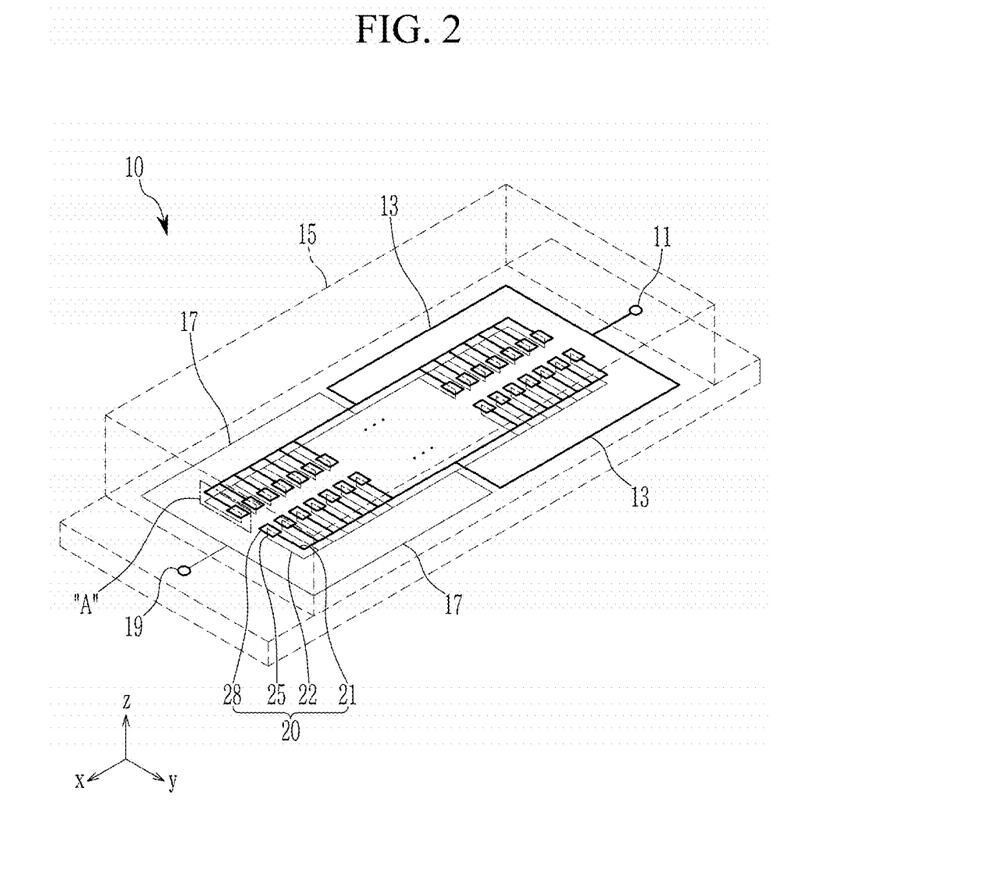
FIG. 2 schematically illustrates an embodiment of alignment of fine channels for ink transfer of an inkjet printhead.
Figure 3:
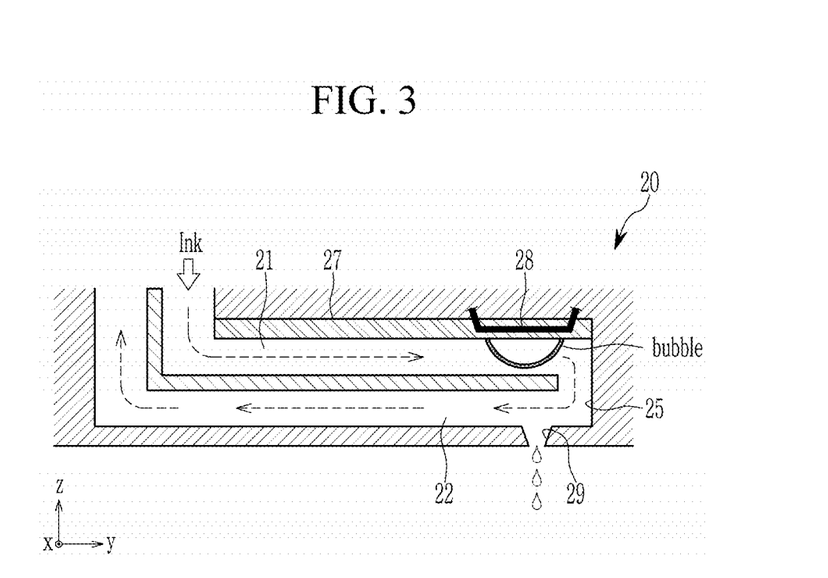
FIG. 3 is a schematic cross-sectional view of a unit spray portion at the periphery of a nozzle in the enlarged part "A" in FIG. 2.

FIG. 2 schematically illustrates an embodiment of alignment of fine channels for ink transfer of an inkjet printhead in an embodiment, and FIG. 3 is a schematic cross-sectional view of a unit spray portion at the periphery of a nozzle in the enlarged part "A" in FIG. 2.

Referring to FIG. 2, an inkjet printhead 10 in the illustrated embodiment may include a plurality of unit spray portions 20 respectively corresponding to a plurality of nozzles 28 (refer to FIG. 3) for spraying ink. The plurality of unit spray portions 20 may be arranged along a length direction (i.e., an x-axis direction in the drawing) of the inkjet printhead 10, for example, and two sets of unit spray portions 20 may be arranged to face each other along a width direction (i.e., a y-axis direction in the drawing) of the inkjet printhead 10.

A supply distribution channel 13 in communication with the ink inlet 11 may extend to a first fine channel 21 of the plurality of unit spray portions 20, and a discharge distribution channel 17 in communication with the ink outlet 19 is a second fine channel 22 of the plurality of unit spray portions 20. Therefore, the supply distribution channel 13 may be defined in the same layer as the first fine channel 21, and the discharge distribution channel 17 may be defined in the same layer as the second fine channel 22.

Referring to FIG. 3, in the illustrated embodiment, the first fine channel 21 and the second fine channel 22 are defined in the inkjet printhead 10 including a head body 15 where a connection via hole 25 between the first fine channel 21 and the second fine channel 22 is defined. The first fine channel 21, the connection via hole 25, and the second fine channel 22 may be defined in such a way that may circulate the inflowed ink while being in communication with each other to guide the flow in one direction. Here, the first and second fine channels 21 and 22 and the connection via hole 25 may have a diameter of a micro-scale, and thus a capillary phenomenon may occur inside the fine and second channels 21 and 22 and the connection via hole 25.

Here, the connection via hole 25 may extend to the opposite end of the end of the first fine channel 21 where the first fine channel 21 is connected to ink inlet 11. In addition, the connection via hole 25 may be connected to the opposite end of the end of the second fine channel 22 where the second fine channel 22 is connected to the ink outlet 19. When viewed in the planar direction, the second fine channel 22 may be defined to at least partially overlap with the first fine channel 21. Therefore, the ink inflowed to the first fine channel 21 may be returned through the second fine channel 22 by changing a layer while passing through the connection via hole 25.

The second fine channel 22 is disposed below the first fine channel 21, and the first fine channel 21 and the second fine channel 22 may be communicated in a thickness direction (i.e., the z-axis direction in the drawing) of the head body 15 through the connection via hole 25. The first fine channel 21 is connected to the ink inlet 11 to guide the inflow of ink, and the second fine channel 22 is connected to the ink outlet 19 to guide the outflow of ink.

In addition, a nozzle 29 opened downward from the second fine channel 22 may be defined in the head body 15. The nozzle 29 may be disposed closer to the connection via hole 25 than to the end of the first fine channel 21 and the end of the second fine channel 22, and may be disposed eccentrically with the connection via hole 25. That is, when viewed in the planar direction (x-y planar direction in the drawing), the nozzle 29 may be disposed closer to the connection via hole 25 in the entire length of the second fine channel 22, and the center of the nozzle 29 may be disposed to not overlap the center of the connection via hole 25. In an embodiment, the nozzle 29 may be formed or provided with a diameter in the range of about 10 micrometers ($\mu m$) to about 30 diameter, for example, but the invention is not limited thereto.

The micro heater 28 may be disposed on the top of the first fine channel 21, and a micro heater 28 may be disposed closer to the connection via hole 25 than to the end of the first fine channel 21 and the end of the second fine channel 22. In addition, the micro heater 28 may be disposed eccentrically with the connection via hole 25. That is, when viewed in the planar direction (x-y planar direction in the drawing), the micro heater 28 may be disposed closer to the connection via hole 25 of the entire length of the first fine channel 21, and the center of the micro heater 28 may be disposed so as to not overlap with the center of the connection via hole 25. In an embodiment, the micro heater 28 may have a unit line width of a micro scale, and may be included within the range of about 1 $\mu m$ to about 20 $\mu m$, for example.

In an embodiment, the micro heater 28 may include gold (Au) or platinum (Pt). In an embodiment, gold (Au) or platinum (Pt) may be deposited in a thickness of about 0.2 $\mu m$ to about 0.3 $\mu m$ using an electron beam evaporator (e-beam evaporator), for example, and may be patterned by etching a pattern through a photolithography process using a photomask and a photoresist and removing the exposed gold (Au) or platinum (Pt) with an etchant. In an embodiment, such a micro heater 28 may be driven with a driving voltage of about 1.5 volts (V) to about 2.2 V, for example.

In the inkjet printhead 10 in the illustrated embodiment, ink is supplied through the first fine channel 21 without a separate ink reservoir, and the micro heater 28 is disposed next to the first fine channel 21, and thus when the ink passes, a local area next to the first fine channel 21 is instantaneously heated with the micro heater 28 and the ink is sprayed at the pressure when the ethanol component of the ink is evaporated.

When ZnO ink is applied, for example, a ZnO solution may be injected due to a pressure difference caused by the vapor generated instantaneously, for example. Since a vaporization temperature of ethanol included in a mixed solvent of ZnO ink is about 78.3 degrees Celsius, heating the solution for a short time does not cause a problem with the material because vapor may be generated in the ink even at a low temperature, and a ZnO inorganic oxide has excellent thermal stability compared to organic materials.

In addition, a passivation layer 27 may be adjacent to the top of the first fine channel 21 and to accommodate the micro heater 28. In an embodiment, the passivation layer 27 may include an insulating polymer, and may include a polyimide ("PI"), for example. That is, the micro heater 28 may be inserted and disposed in the passivation layer 27 that includes an insulating polymer at the periphery of the first fine channel 21, thereby enabling in high resolution jetting of the inkjet printhead 10 in the illustrated embodiment.

As described above, the inkjet printhead 10 in the illustrated embodiment has a structure in which ink is circulated through the first and second fine channels 21 and 22, and thus it may have a continuous flow path in which ink is recovered after passing the micro heater 28 and the nozzle 29, and in addition, it is possible to prevent the precipitation of an inorganic oxide ink and clogging of the nozzle 29.

In addition, the inkjet head of a general bubble jet spraying method may only be disposed up to one row, whereas the micro heater 28 is disposed above the nozzle 29 of the inkjet printhead 10 in the illustrated embodiment, and thus multiple nozzle designs are possible, allowing alignment in the desired row and column.

Figure 4:
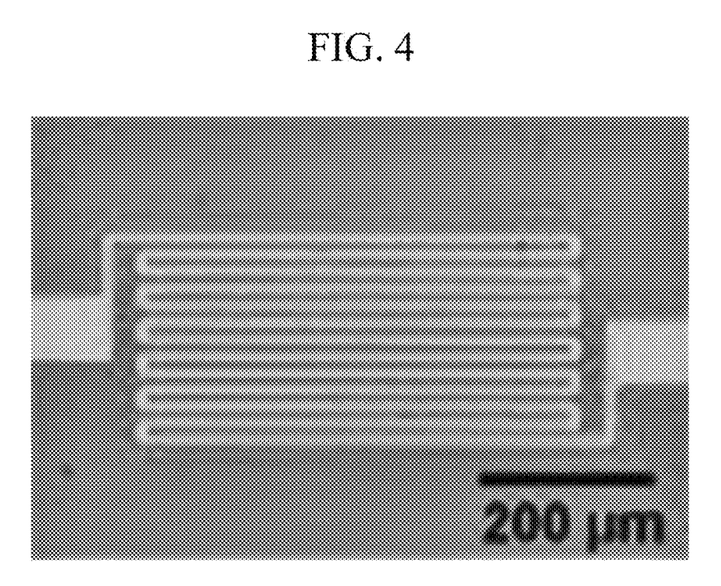
FIG. 4 is a photograph of an embodiment of the micro heater of the inkjet printhead.
Figure 5:
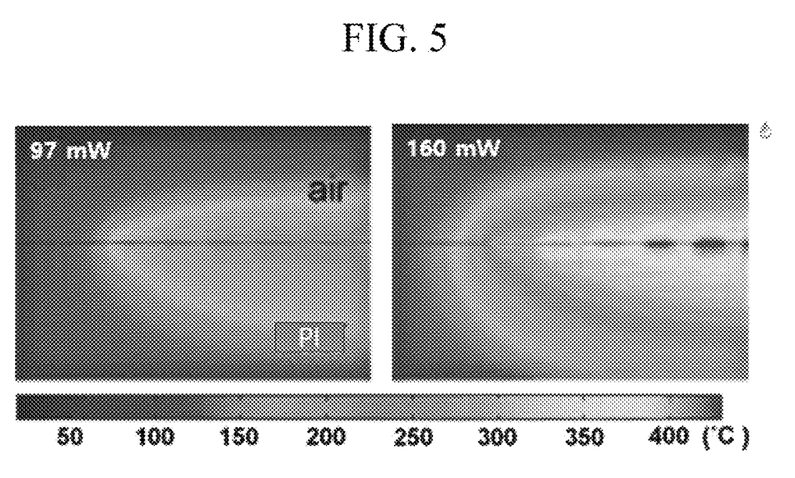
FIG. 5 is a graph that shows a simulation result of the micro heater shown in FIG. 4.

FIG. 4 is a photograph of an embodiment of the micro heater of the inkjet printhead in the embodiment, and FIG. 5 is a graph that shows a simulation result of the micro heater shown in FIG. 4.

Referring to FIG. 4, the micro heater 28 (refer to FIGS. 2 and 3) of the inkjet printhead 10 (refer to FIG. 2) in the illustrated embodiment may have a structure in which micro heating wires meander. Thus, a resistance value of the micro heater 28 may be adjusted by a line width or dimension of the micro heating wire.

Referring to FIG. 5, from the cross-section of the micro heater 28, a result of heat transfer modeling transferred to the passivation layer 27 that includes a polymer may be confirmed.

Ink used when printing an electronic device by applying the inkjet printhead 10 configured as described above may be formed or provided by mixing inorganic oxide NPs with an alcohol-based solvent. Here, the inorganic oxide NP may include at least one of a metal or semimetal oxide NPs ZnO, ZnMgO, ZnAlO, ZnCoO, ZnGaO, ZnZrO, ZnYO, a transition metal alloy, or any combinations thereof, for example.

The inkjet printhead 10 in the embodiment may be applied to a mixed solvent of ZnO NPs for manufacturing a QD-LED device and to print the same. In general, a ZnO layer, which is used for an electron transport layer ("ETL"), includes crystalline inorganic oxide NPs, has high electron mobility and hole blocking characteristics, and is easy to form a film on a light emission layer ("EML") by a solution process. The piezo method induces precipitation of ZnO passing through an actuator portion due to a high voltage and clogs the nozzle, and thus it is difficult to apply inorganic oxide NP ink used for the EML of QLEDs such as ZnO or ZnMgO.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the invention.

What is claimed is:

1. An inkjet printhead comprising:
   a head body in which a first fine channel which is connected to an ink inlet and thus guides an inflow of ink, a second fine channel which is disposed below an interlayer interposed between the first fine channel and the second fine channel parallel to each other, communicated with the first fine channel through a connection via hole defined in the interlayer, and guides an outflow of the ink by being connected to an ink outlet, and a nozzle which is opened downward from the second fine channel are defined; and
   a micro heater which is disposed closer to the connection via hole in an upper portion of the first fine channel than to an end of the first fine channel where the first fine channel is connected to the ink inlet or an end of the second fine channel where the second fine channel is connected to the ink outlet.

2. The inkjet printhead of claim 1, further comprising a passivation layer which is adjacent to the upper portion of the first fine channel and accommodates the micro heater.

3. The inkjet printhead of claim 2, wherein the passivation layer comprises a polyimide.

4. The inkjet printhead of claim 1, wherein
   the first fine channel, the connection via hole, and the second fine channel are communicated with each other and guide a flow of the ink in one direction such that the ink is circulated.

5. The inkjet printhead of claim 1, wherein
   the micro heater is disposed eccentrically with the connection via hole.

6. The inkjet printhead of claim 1, wherein
   the nozzle is disposed eccentrically with the connection via hole.

7. The inkjet printhead of claim 1, wherein
   the nozzle is disposed closer to the connection via hole than to the end of the first fine channel or the end of the second fine channel.

8. The inkjet printhead of claim 1, wherein
   the connection via hole extends to an opposite end of the end of the first fine channel.

9. The inkjet printhead of claim 1, wherein
   the connection via hole extends to an opposite end of the end of the second fine channel.

10. The inkjet printhead of claim 1, wherein
    in a plan view, the second fine channel has a portion overlapping the first fine channel.

11. The inkjet printhead of claim 1, wherein
    the ink includes organic or inorganic oxide nanoparticles.

12. The inkjet printhead of claim 11, wherein
    the organic or inorganic oxide nanoparticles include inorganic oxide nanoparticles, and the inorganic oxide nanoparticles include metal or semimetal oxide nanoparticles.

13. The inkjet printhead of claim 12, wherein
    the metal or semimetal oxide nanoparticles include nanoparticles of oxides including zinc or nanoparticles of oxides including alloys of transition metals.

14. The inkjet printhead of claim 12, wherein
    the oxide nanoparticles including zinc include ZnO, ZnMgO, ZnAlO, ZnCoO, ZnGaO, ZnZrO, ZnYO, or any combinations thereof.

* * * * *